United States Patent [19]

Heimlicher

[11] Patent Number: 4,942,372
[45] Date of Patent: Jul. 17, 1990

[54] METHOD AND CIRCUIT FOR REDUCTION OF TEMPERATURE DEPENDENCY IN AN OSCILLATOR

[76] Inventor: Peter Heimlicher, Klein-Schoenberg 112, CH-1700 Fribourg, Switzerland

[21] Appl. No.: 272,350

[22] Filed: Nov. 17, 1988

[30] Foreign Application Priority Data

Dec. 1, 1987 [CH] Switzerland .................. 4679/87

[51] Int. Cl.$^5$ .................. H03B 5/08; H03L 1/00
[52] U.S. Cl. .................. 331/65; 331/167; 331/176
[58] Field of Search ........ 331/65, 66, 117 R, 117 FE, 331/167, 176

[56] References Cited

U.S. PATENT DOCUMENTS

| 2,235,019 | 3/1941 | Johannson | 331/176 |
| 3,805,185 | 4/1974 | Kishi et al. | 331/65 |
| 4,509,023 | 4/1985 | Heimlicher | 331/176 |
| 4,638,262 | 1/1987 | Miyamoto | 331/65 |

FOREIGN PATENT DOCUMENTS

| 0070796 | 1/1983 | European Pat. Off. |
| 2604485 | 8/1976 | Fed. Rep. of Germany |
| 31513403 | 10/1986 | Fed. Rep. of Germany |

Primary Examiner—Siegfried H. Grimm
Attorney, Agent, or Firm—Marks Murase & White

[57] ABSTRACT

The temperature dependency of an oscillator can be reduced by a method and circuit that uses two positive feedback paths to provide the positive feedback necessary for maintaining the oscillation of an LC-oscillating circuit. One of the two feedback paths compensates the temperature dependent influences while the other compensates temperature independent influences.

9 Claims, 2 Drawing Sheets

METHOD AND CIRCUIT FOR REDUCTION OF TEMPERATURE DEPENDENCY IN AN OSCILLATOR

BACKGROUND OF THE INVENTION

The present invention relates to a method and a circuit for the reduction of the temperature dependency of the oscillting properties of a LC oscillator.

Oscillators which make use of a LC-oscillating circuit as a frequency determning element are utilized in inductive proximity switches. When the driving blade of an inductive proximity switch approaches the coil of the LC-oscillating circuit, it damps the quality of the latter which is utilized by an evaluation circuit for producing an output signal.

The principal disadvantage of known inductive proximity switches is their relatively small switching distance. The switching distance can only be increased with a concomitant adverse effect on the high temperature dependency of this switching distance.

A very elegant solution to this problem has been described in U.S. Pat. No. 4 509 023. This solution permits in practice, elimination of the principal cause of the temperature dependency, that is the temperature coefficient of the copper resistance.

A disadvantage of the method of U.S. Pat. No. 4 509 023 is that only the loss relating to the temperature coefficient of the copper resistance of the coil is cancelled. However, a LC-oscillating circuit still has a number of other sources of losses which operate to oppose any further increase of the temperature independency of the oscillator.

SUMMARY OF THE INVENTION

The object of the present invention is directed to a method which takes into consideration other sources of losses resulting in a substantial improvement of the overall temperature stability of a LC-oscillator. This is achieved by distributing the path of the positive feedback of the oscillator into two partials paths. The first path is so temperature dependent that the losses of the oscillating circuit with same copper temperature coefficient are compensated. The second path is independent of the temperature, so that temperature constant losses can be compensated. Therefore, the different losses in the LC-oscillating circuit shown in FIG. 1 can be separated into two components:

(1) losses with same temperature coefficients as the one of copper (about +0.4%/° K.); and
(2) losses independent of the temperature.

The energy necessary for the compensation of these losses in order to sustain the oscillation is fed through two coupling paths, each of a different type. These coupling paths can coincide in the same circuit and they are represented by an ohmic and a capacitive part. The invention will be described further with reference to the drawings in which:

DETAILED DESCRIPTION OF THE INVENTION

The real course of the total losses is formed by superposition.

Figure 1:
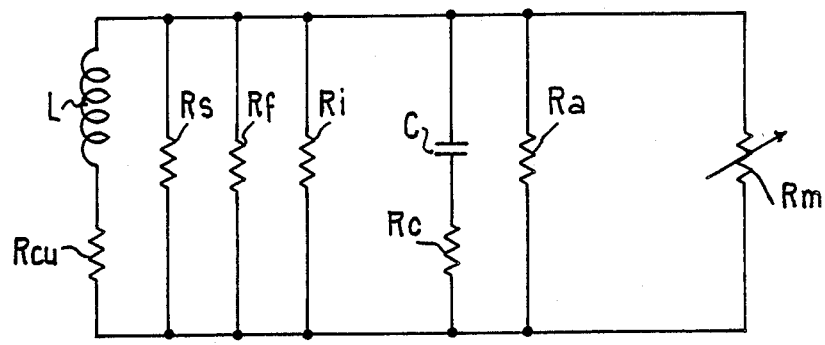
FIG. 1 is a schematic diagram of an equivalent circuit illustrating the losses in the oscillating circuit.

In the equivalent circuit of the LC-oscillating circuit according to FIG. 1, the illustrated resistances correspond to the following losses:

$R_{cu}$ copper resistance of the oscillating coil
$R_s$ skin-effect losses
$R_f$ losses in the core
$R_i$ dielectric losses in the insulation (except in C), in particular in the winding insulation
$R_c$ losses of the capacitor
$R_a$ losses in the internal screenings and in the housing
$R_m$ external losses, in particular in the driving blade of a proximity switch.

A typical representative of the first group of losses, that is, losses with the same copper temperature coefficients, is obviously $R_{cu}$. In the second group of losses, that is, losses independent of the temperature, on finds largely $R_m$ and $R_c$ (as far as C is a ceramic capacitor). The other losses can be formed by superposition.

The source of losses $R_m$ is of particular interest. For a proximity switch $R_m$ is the losses caused by the driving blade. In the case of an inductive proximity switch with the distance of the driving blade from the coil L, the losses $R_m$ change with the intensity of attenuation while all other losses remain constant.

Figure 2:
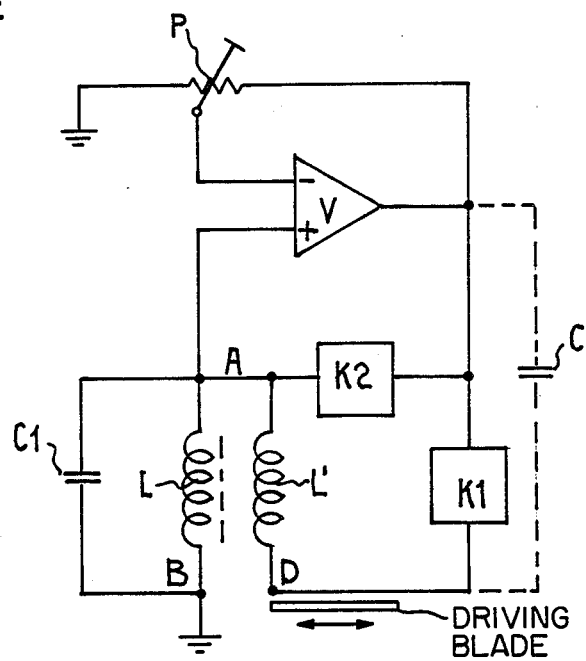
FIG. 2 is a schematic diagram illustrating the basic construction of a circuit according to the present invention.

FIG. 2 shows the basic application of the method of the present invention to a LC-oscillator circuit such as that described in U.S. Pat. No. 4 509 023. This known circuit comprises an oscillating circuit LC1 with a bifilar coil L, L'. An amplifier V with a potentiometer P in the negative feedback circuit maintains the oscillation of the known circuit by positive feedback through a capacitor C to the terminal D of the coil L' of the bifilar oscillating coil. Therefore as known, a positive feedback depending on $R_{cu}$ takes place.

Instead of the positive feedback capacitor C used up to now, the positive feedback path of the oscillator according to the present invention consists of the coupling elements K1 and K2. As known, K1 couples the energy for the compensation of the losses of the first group in a temperature compensating manner. In accordance with the present invention, the energy for the compensation of the temperature independent losses, the second group, is temperature independently coupled through K2. The energy for the losses the temperture coefficient of which has to be formed by superposition as mentioned above is coupled according to an appropriate distribution through K1 and K2. The temperature coefficient of the losses cannot be ideally formed by superposition because of nonlinearities. These losses have to be maintained as small as possible. They are then distributed on both groups in the best possible approximation.

In the case of an inductive proximity switch, Rm has to be specially considered. In the usual apparatuses on the market with a fixed adjusted switching distance, Rm can also be considered as fixed, namely at its value at the switching point. However this is not the case in proximity switches with a variable switching point, resp. without switching point (linear proximity switches) and the temperature compensation can be optimal at only one point. The greater the distance from this point, the poorer the temperature compensation. In accordance with the invention, this problem can be solved in a simple manner in that the variable losses in the driving blade represented by Rm are compensated by a variation of the coupling by means of the coupling element K2 (Rm belongs to group 2). This results in an optimal temperature compensation of the switching distance of the proximity switch for all values of Rm.

Figure 3:
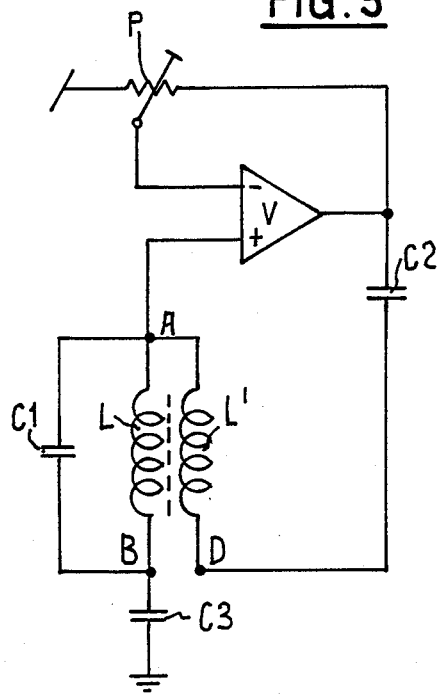
FIG. 3 is a schematic diagram illustrating an embodiment of the circuit of the present invention where K1 comprises capacitor C2 and K2 is formed by capacitvie voltage divider C2-C3.

In accordance with FIG. 3, the coupling element K1 consists as known of a capacitor C2. K2 is formed by the capacitive voltage divider C2-C3 producing a temperature indpendent voltage at terminal B which permits the desired temperature independent positive feedback. A variation of the resistance of the coils L and L' is practically without effect.

Figure 4:
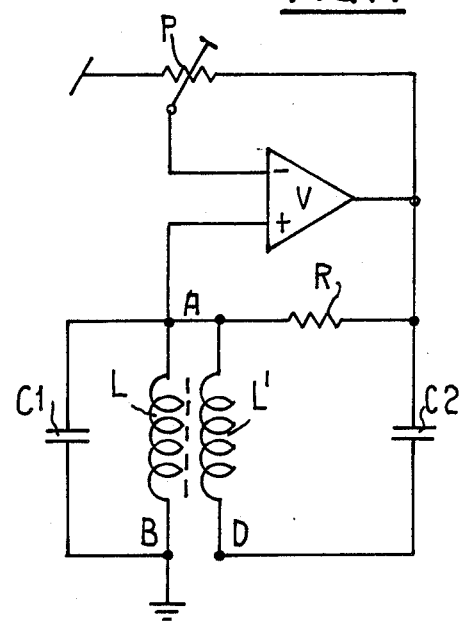
FIG. 4 is a schematic diagram illustrating an embodiment of the circuit of the present invention where K1 comprises capacitor C2 and K2 comprises resistor R.

In accordance with FIG. 4, K1 is unaltered but K2 consists now of the resistor R which again produces the desired temperature independent positive feedback.

Figure 5:
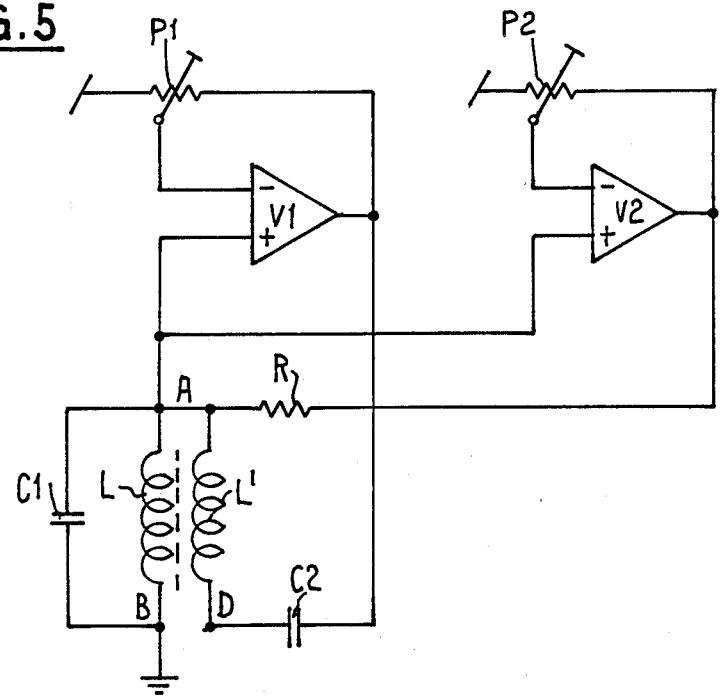
FIG. 5 is a schematic diagram illustrating an embodiment of the circuit of the present invention where K1 comprises capacitor C2 and K2 comprises amplifier V2 and resistor R.

In accordance with FIG. 5, as known, K1 takes place through V1 and C2. In this case, K2 consist of a separate amplifier V2 and of the known resistor R of FIG. 4. The advantage of this circuit is that the positive feedback through K2 is adjustable by means of the potentiometer P2 is much lighter to execute as a possible exchange of R.

K1 and K2 have to be dimensioned so that typically about 80% of the energy is fed back through K1 (positive feedback) and the rest through K2. The precise ratio depends on the conditions in the LC circuit. In the case of variable Rm, must be adjustable.

I claim:

1. A method for reducing the temperature dependency of the oscillating properties of an LC-oscillator having an oscillating circuit including a coil having temperature dependent copper losses; a condenser; and an amplifier means having input means and output means, said input means and said output means being connected to said oscillating circuit; comprising the steps of:

inserting a first positive feedback path having a temperature dependent feedback characteristic between said output means and said oscillating circuit;

inserting a second feedback path having a temperature independent feedback characteristic between said output means and said oscillating circuit;

varying the attenuation of said oscillating circuit; and varying the feedback characteristics of said second path to compensate for said variable attenuation.

2. A circuit for reducing the temperature dependency of the oscillating properties of an LC-oscillator having an oscillating circuit including:

a coil having temperature dependent copper losses;

a condenser;

amplifier means having input means and output means, said input means and said output means being connected to said oscillating circuit;

positive feedback means connected between said output means and said oscillating circuit, said feedback means comprising a first feedback path having a temperature compensating feedback characteristic and a second feedback path having a temperature independent feedback characteristic;

means for variably attenuating said oscillating circuit; and means for varying the feedback in said second feedback path to compensate for said variable attenuation.

3. The circuit according to claim 2, wherein said first feedback path is formed by a first capacitor and said second feedback path is formed by a capacitive voltage divider comprising said first capacitor and a second capacitor.

4. The circuit according to claim 2, wherein said variable attenuation has resistance Rm and positive feedback is modified through said second feedback path.

5. The circuit according to claim 2, wherein said positive feedback means comprises a combined ohmic and capacitive feedback.

6. The circuit according to claim 2, wherein said second path comprises a capacitive voltage divider.

7. The circuit according to claim 2, wherein said temperature independent feedback path comprises a second amplifier means coupled to said oscillating circuit and a resistor connected between an output of the second amplifier means and said input means.

8. The circuit according to claim 2, wherein said first and second feedback paths each include separate amplifiers.

9. A proximity switch having a measuring circuit including an oscillating circuit with a coil having temperature dependent copper losses and a condenser, and a driving blade displaceable within the electromagnetic field of said coil for variably attenuating said oscillating circuit, amplifier means connected to said oscillating circuit through feedbacks means for sustaining oscillation therein, said feedback means comprising a first feedback path having a temperature compensating feedback characteristic and a second feedback path having a temperature independent feedback characteristic, said second feedback path having a variable feedback characteristic for compensating for said variable attenuation.

* * * * *